(12) United States Patent
Gu et al.

(10) Patent No.: US 10,872,823 B2
(45) Date of Patent: Dec. 22, 2020

(54) DEVICE INTEGRATED WITH JUNCTION FIELD EFFECT TRANSISTOR AND METHOD FOR MANUFACTURING THE SAME

(71) Applicant: CSMC TECHNOLOGIES FAB2 CO., LTD., Jiangsu (CN)

(72) Inventors: Yan Gu, Jiangsu (CN); Shikang Cheng, Jiangsu (CN); Sen Zhang, Jiangsu (CN)

(73) Assignee: CSMC TECHNOLOGIES FAB2 CO., LTD., Wuxi New District (CN)

( * ) Notice: Subject to any disclaimer, the term of this patent is extended or adjusted under 35 U.S.C. 154(b) by 0 days.

(21) Appl. No.: 16/329,550

(22) PCT Filed: Aug. 31, 2017

(86) PCT No.: PCT/CN2017/099841
§ 371 (c)(1),
(2) Date: Feb. 28, 2019

(87) PCT Pub. No.: WO2018/041192
PCT Pub. Date: Mar. 8, 2018

(65) Prior Publication Data
US 2019/0259669 A1     Aug. 22, 2019

(30) Foreign Application Priority Data
Aug. 31, 2016   (CN) .......................... 2016 1 0794437

(51) Int. Cl.
H01L 21/8234     (2006.01)
H01L 21/265      (2006.01)
(Continued)

(52) U.S. Cl.
CPC ............. *H01L 21/823487* (2013.01); *H01L 21/26513* (2013.01); *H01L 21/30604* (2013.01);
(Continued)

(58) Field of Classification Search
CPC ............. H01L 29/1058; H01L 29/1066; H01L 29/66893–66924; H01L 29/8086;
(Continued)

(56) References Cited

U.S. PATENT DOCUMENTS 4,454,523 A    6/1984   Hill
6,303,947 B1  10/2001   Ueno
(Continued)

FOREIGN PATENT DOCUMENTS

CN     1866542 A    11/2006
CN     2836242 Y    11/2006
(Continued)

OTHER PUBLICATIONS

Search Report dated Feb. 11, 2020 issued in corresponding European Patent Application No. 17845494.8 (10 pages).
(Continued)

*Primary Examiner* — Tucker J Wright
(74) *Attorney, Agent, or Firm* — Polsinelli PC

(57) ABSTRACT

A device integrated with JFET, the device is divided into a JFET region and a power device region, and the device includes: a drain (201) with a first conduction type; and a first conduction type region disposed on a front surface of the drain (201); the JFET region includes: a first well (205) with a second conduction type and formed in the first conduction type region; a second well (207) with a second conduction type and formed in the first conduction type region; a JFET source (212) with the first conduction type; a metal electrode formed on the JFET source (212), which
(Continued)

is in contact with the JFET source (212); and a second conduction type buried layer (203) formed under the JFET source (212) and the second well (207).

10 Claims, 4 Drawing Sheets

(51) Int. Cl.
| | |
|---|---|
| *H01L 21/306* | (2006.01) |
| *H01L 27/06* | (2006.01) |
| *H01L 29/08* | (2006.01) |
| *H01L 29/10* | (2006.01) |
| *H01L 29/40* | (2006.01) |
| *H01L 29/45* | (2006.01) |
| *H01L 29/66* | (2006.01) |
| *H01L 29/78* | (2006.01) |
| *H01L 29/808* | (2006.01) |
| *H01L 27/085* | (2006.01) |
| *H01L 21/8232* | (2006.01) |

(52) U.S. Cl.
CPC ...... *H01L 21/8232* (2013.01); *H01L 27/0617* (2013.01); *H01L 27/085* (2013.01); *H01L 29/0843* (2013.01); *H01L 29/0865* (2013.01); *H01L 29/1095* (2013.01); *H01L 29/401* (2013.01); *H01L 29/45* (2013.01); *H01L 29/66712* (2013.01); *H01L 29/66909* (2013.01); *H01L 29/78* (2013.01); *H01L 29/7803* (2013.01); *H01L 29/8083* (2013.01)

(58) Field of Classification Search
CPC ......... H01L 2924/13062; H01L 27/098; H01L 27/14679; H01L 29/04–045; H01L 29/16–1608; H01L 29/18–185; H01L 29/22–2206; H01L 29/36–365; H01L 29/66712–66734; H01L 29/7802–7815; H01L 21/265; H01L 21/823412; H01L 21/823425; H01L 21/823437; H01L 21/823487; H01L 21/823493; H01L 27/0705; H01L 27/085; H01L 29/10; H01L 29/1095; H01L 29/66909; H01L 29/8083; H01L 21/26513; H01L 21/8234; H01L 27/06; H01L 27/0617; H01L 29/66; H01L 29/808

See application file for complete search history.

(56) References Cited

U.S. PATENT DOCUMENTS

| | | |
|---|---|---|
| 2011/0180858 A1 | 7/2011 | Chiang et al. |
| 2013/0082321 A1* | 4/2013 | Sobti ................ H01L 29/42376 |
| | | 257/329 |
| 2014/0117415 A1 | 5/2014 | Ma et al. |

FOREIGN PATENT DOCUMENTS

| | | |
|---|---|---|
| CN | 102034820 A | 4/2011 |
| CN | 102339755 A | 2/2012 |
| CN | 105226058 A | 1/2016 |
| EP | 1058303 A1 | 12/2000 |

OTHER PUBLICATIONS

Office Action dated Oct. 11, 2019 issued in corresponding Chinese Patent Application No. 201610794437.6 (7 pages).
International Search Report dated Dec. 5, 2017 in the parent application PCT/CN2017/099841. 4 pages.

* cited by examiner

DEVICE INTEGRATED WITH JUNCTION FIELD EFFECT TRANSISTOR AND METHOD FOR MANUFACTURING THE SAME

CROSS REFERENCE TO RELATED APPLICATIONS

This application is a National Phase filing under 35 U.S.C. § 371 of PCT/CN2017/099841 filed on Aug. 31, 2017, and claims priority to Chinese Patent Application No. CN 201610794437.6, entitled "COMPONENT HAVING INTEGRATED JUNCTION FIELD-EFFECT TRANSISTOR, AND METHOD FOR MANUFACTURING SAME" filed on Aug. 31, 2016. The entire contents of each application are hereby incorporated by reference.

TECHNICAL FIELD

The present disclosure relates to semiconductor manufacturing technology, and more particularly to a device integrated with a junction field effect transistor (JFET). In addition, the present disclosure also relates to a method for manufacturing a device integrated with JFET.

BACKGROUND

Integrating a high-voltage junction field effect transistor (JFET) on high-voltage process platform is an advanced development and concept in the recent field of smart power integrated circuit, which can greatly improve the on-state performance of vertical power devices, and significantly reduce the chip area, thereby meeting the mainstream trend for manufacturing the smart power device nowadays.

The conventional structure of high-voltage integrated JFET can be achieved by a simpler process, but it cannot be applied in the smart power integrated field on a large scale due to the unstable pinch-off voltage thereof.

As to a conventional Vertical Double-diffused MOSFET (VDMOS) integrated JFET, the current flows through the JFET from the bottom drain terminal and flows out of source 2 when the VDMOS is in turn-on stage. When a gradually increased voltage Vg2 is applied to the source 2, and in the same time, the same voltage Vg1 is applied to the gate; when the Vg2>the pinch-off voltage Voff, the depletion layer of the JFET blocks the current, that is, a pinch-off phenomenon occurs. At this time, Vg1>Vth (Vth is the threshold voltage of VDMOS), VDMOS is turned on, and a turn-on process is completed. Then the JFET absorbs an abrupt current of the VDMOS on the Miller platform, which makes the startup more gradual, and the current can be approximately linearly transformed. Therefore, the JFET has a significant effect for the stability of the device during the startup process. The power devices have an advantage of integrating parasitic JFET on process platforms thereof.

The most important characteristics of the integrated parasitic JFET are the stability of the overall breakdown voltage and of the pinch-off voltage. The most ideal is that the breakdown voltage of the device remains the same after being integrated, and the breakdown point is preferably maintained at the breakdown point of the power VDMOS. The joint of the conventional integrated structure VDMOS and JFET only uses the substrate for isolation, and only the lateral distance of the substrate epitaxy can be extended to ensure the margin when depleted, which may increase the area of the entire die. Meanwhile, since the epitaxial layer specifications have deviation, the breakdown point may transfer if a slight change occurs in the process, and the breakdown point may transfer from the cell region of the body to the JFET region or the joint, which greatly reduces the stability of the breakdown and results in a phenomenon of breakdown voltage creep. The conventional structure generally uses a self-aligned P-type implanted substrate as a P-type pinch-off substrate. Since the P-type substrate of the cell region of the VDMOS has a very shallow depth of the longitudinal junction (generally only from 3 microns to 5 microns), the longitudinal channel of the JFET is very short, the length thereof cannot be adjusted, and then the pinch-off voltage is very unstable. It can be seen that the pinch-off voltage Voff may increase from 11 V up to 20 V when the drain voltage changes from 50 V to 100 V by simulation. However, it needs a stable Voff in practical applications, therefore the conventional structure is difficult to meet the actual requirement.

SUMMARY

According to various embodiments of the present disclosure, it is necessary to provide a device integrated with a junction field effect transistor (JFET) and method for manufacturing the same to solve the problem that the pinch-off voltage of the conventional JFET is unstable.

A device integrated with JFET, the device is divided into a JFET region and a power device region, and the device includes: a drain with a first conduction type, while a part of the drain is located in the JFET region and the other part of the drain is located in the power device region; and a first conduction type region disposed on a front surface of the drain, while a part of the first conduction type region is located in the JFET region, and the other part of the first conduction type region is located in the power device region; the JFET region includes: a first well with a second conduction type, which is formed in the first conduction type region; a second well with a second conduction type, which is formed in the first conduction type region, while an ion concentration of the second well is higher than an ion concentration of the first well and the first conduction type is opposite to the second conduction type; a JFET source with the first conduction type; a metal electrode formed on the JFET source, which is in contact with the JFET source; and a second conduction type buried layer formed under the JFET source and the second well. A method for manufacturing a device integrated with JFET, the device includes a JFET region and a power device region, and the method includes: providing a substrate of a first conduction type, and a first conduction type region is formed on the substrate; while the first conduction type is opposite to the second conduction type; forming a second conduction type buried layer in the first conduction type region of the JFET region; implanting ions of the second conduction type into the first conduction type region, and forming a first well in the first conduction type region by driving-in; growing a field oxide layer and a gate oxide layer in turn, and forming a polysilicon layer on the surface of the first conduction type region; implanting the ions of the second conduction type into the first conduction type region and forming a plurality of second wells by driving-in; implanting ions of the first conduction type, to form a JFET source at the JFET region and form a power device source at the power device region; and photoetching and etching a contact hole, depositing a metal layer, filling the metal layer into the contact hole, to form a metal electrode of the JFET source, a JFET metal gate and a metal contact of the power device source respectively.

The details of one or more embodiments of the present disclosure are set forth in the accompanying drawings and description below. Other features, objects, and advantages of the present disclosure will be apparent from the description, drawings and claims.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

For the convenience of understanding the present disclosure, a more comprehensive description of the present disclosure will be made according to the relevant drawings below. One or more preferred embodiments of the disclosure are given in drawings. However, the present disclosure may be implemented in many different forms and is not limited to the embodiments described herein. On the contrary, the purpose of providing these embodiments is to make the disclosure of the disclosure more thorough and comprehensive.

Unless otherwise defined, all terms (including technical and scientific terms) used herein have the same meaning as commonly understood by one of ordinary skill in the art to which this disclosure belongs. The terms used in the specification of the present application are only for the purpose of describing specific embodiments, and not to limit the present application. The term "and/or" used herein includes any and all combinations of one or more relevant listed items.

It should be understood that when an element is referred to as being "disposed" or "provided" on another element, it can be directly on the other element or intervening elements may be present. When an element is referred to as being "connected" or "coupled" to another element, it can be directly connected or coupled to another element or intervening elements may be present. The terms "vertical", "horizontal", "up", "down", "left", "right", and the like, as used herein are for illustrative purposes only.

The semiconductor field of terms used herein are common technical terms used by those persons skilled in the art, for example, as to a P type impurity and an N type impurity, in order to distinguish doping concentration, the P+ type is simply represented as the P type with heavy doping concentration, the P type is represented as the P type with normal doping concentration, and the P− type is represented as the P type with mild doping concentration, the N+ type is simply represented as the N type with heavy doping concentration, the N type is represented as the N type with normal doping concentration, and the N− type is represented as the N type with mild doping concentration.

Figure 1:
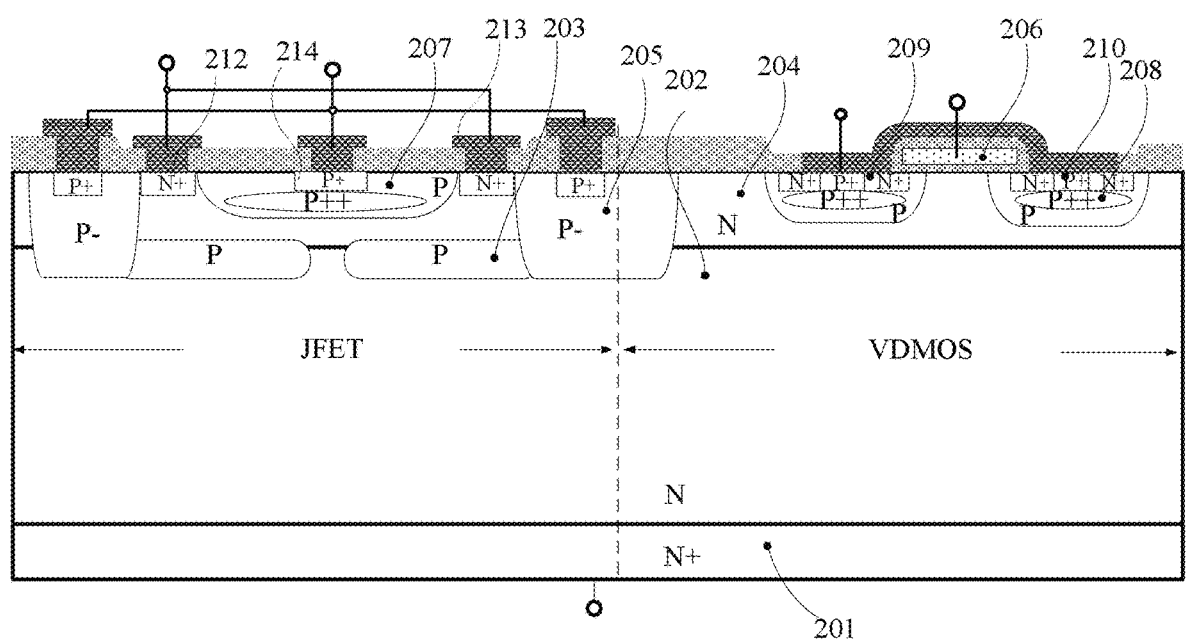
FIG. 1 is a schematic view of a cross-sectional structure of a device integrated with JFET in an embodiment.

FIG. 1 is a schematic view of cross-sectional structure of the device integrated with JFET in an embodiment. In the embodiment, the N type is defined as a first conduction type, the P type is defined as a second conduction type, and the device is VDMOS. As shown in FIG. 1, the device is divided into a JFET region and a VDMOS region according to the structure thereof, the drain 201 of the N type on the back surface of the device (that is, a surface facing downward in FIG. 1) is partly used for forming the JFET region, and is partly used for forming the VDMOS region. Similarly, the N type region (including a first N type region 202 and a second N type region 204) on the front surface of drain 201 (that is, a surface facing upward in FIG. 1) is partly used for forming the JFET region, and is partly used for forming the VDMOS region. In the present embodiment, the drain 201 is an N+ drain and the N type region is an N− epitaxial layer. In order to facilitate to form the P type buried layer 203, the N type region forms the first N type region 202 and the second N type region 204 respectively by twice epitaxial processes, it should be understood that in other embodiments, the N type region may also be a single-layer structure provided that the required P type buried layer 203 is formed. The variation of a thickness and concentration of the epitaxial layer may change the pinch-off voltage; the concentration is smaller, the epitaxial thickness is thinner (considering the backward expansion as well as the depth of P well, the total epitaxial thickness of the first N type region 202 and the second N type region 204 is generally greater than 4 microns (μm), and the thickness is typically between 4 microns and 7 microns), and the pinch-off effect is better.

In the present embodiment, the JEFT region includes:

A first well 205, which is a P− well and is formed in the N type region;

A second well 207, which is a high-voltage P well and is formed in the N type region, and an ion concentration of the second well 207 is higher than an ion concentration of the first well 205. The lateral conduction channel of the second N type region 204 is pinched off by depletion of the second well 207 and the P type buried layer 203, and the second well 207 will suffer the reverse voltage when the device is turned off.

A JFET source 212, the N+ JFET source 212 serves as the source contact of the JFET;

A metal electrode of the JFET source, which is formed on the JFET source 212, which is in contact with the JFET source 212;

The P type buried layer 203, which is formed under the JFET source 212 and the second well 207.

The above mentioned device integrated with JFET applies the lateral channel formed by the P type buried layer 203 and the second well 207, so that the channel concentration is more uniform, and a longer lateral channel is designed by layout, and the pinch-off voltage thereof may be more stable.

The embodiment as shown in FIG. 1, a boundary between the JEFT region and the VDMOS region also forms one first well 205, as an isolation well configured to isolate the JEFT region from the VDMOS region. The P− first well 205 is used to assist depletion isolation. The flow-through path of the current can be completely blocked by the deeper P− well isolation, which prevents electric leakage between JFET and VDMOS. In addition, the lower N− epitaxial layer (that is, the first N type region 202) can be assisted to participate in depletion when the device is biased reversely and can withstand the voltage, and the breakdown voltage of the local area can be increased to serve for solidifying the breakdown point. At the same time, the first well 205 serves as the depletion structure of the terminal in the junction terminal extension technology, and can effectively shorten the chip area of the high-voltage VDMOS. In addition, since the junction process of the junction terminal extension exists, the junction depth of the first well 205 greatly exceeds the junction depth of the P type substrate of the VDMOS in the conventional art, thereby resulting in a longer longitudinal current channel. Compared with the conventional structure, the stability of the pinch-off voltage of the device is significantly improved, and the pinch-off voltage is also significantly reduced.

The embodiment as shown in FIG. 1, The JFET region further includes a JFET metal gate 213 and a JFET gate ohmic contact 214. The JFET metal gate 213 is formed on the JFET gate ohmic contact 214 and is in contact with the JFET gate ohmic contact 214. Each of the JFET gate ohmic contacts 214 is formed in the first well 205 and the second well 207 of the JFET region respectively, and the each of JFET gate ohmic contacts 214 is equipotentially connected with each other via the JFET metal gate 213.

In one embodiment, the P type buried layer 203 is at least in contact with one first well 205. In the embodiment as shown in FIG. 1, there is one P type buried layer 203 on each of two sides under the second well 207, and the two P type buried layers 203 are in contact with the one first well 205 respectively. The first well 205 formed by the deep well diffusion is connected to the P type buried layer 203, and the potential of the P type buried layer 203 can be led out, thereby preventing the P-type buried layer 203 from floating, so that the pinch-off voltage thereof can be more stable as the drain voltage changes.

In the embodiment as shown in FIG. 1, the JFET source 212 is formed between the second well 207 and the first well 205 (one first well 205 is adjacent to the second well 207).

In the embodiment as shown in FIG. 1, the VDMOS region includes a gate 206, a second well 207, an N+ VDMOS source 209 disposed in the second well 207, and an Unclamped Inductive Switching (UIS) region 208 of the P++ type disposed under the VDMOS source 209. The ion concentration of the UIS region 208 is higher than the ion concentration of the second well 207. In the embodiment as shown in FIG. 1, The JFET region is also formed with the UIS region 208. Specifically, the UIS region 208 is disposed under the JFET gate ohmic contact 214 in the second well 207, and in the present embodiment, is in the second well 207. In the other embodiments, the UIS region 208 may also be outside the second well 207 and be in the first well 205. The UIS region 208 can reduce the base resistance of the parasitic NPN transistor and increase the avalanche tolerance of the device.

In the embodiment as shown in FIG. 1, there is one second well 207 formed on each of the two sides under the gate 206. The VDMOS source 209 is formed in the two second wells 207, and the VDMOS source 209 is divided into two blocks in each of the two second wells 207. The device further includes a P+ type ohmic contact region 210 formed between the two blocks of the VDMOS source 209.

Figure 2:
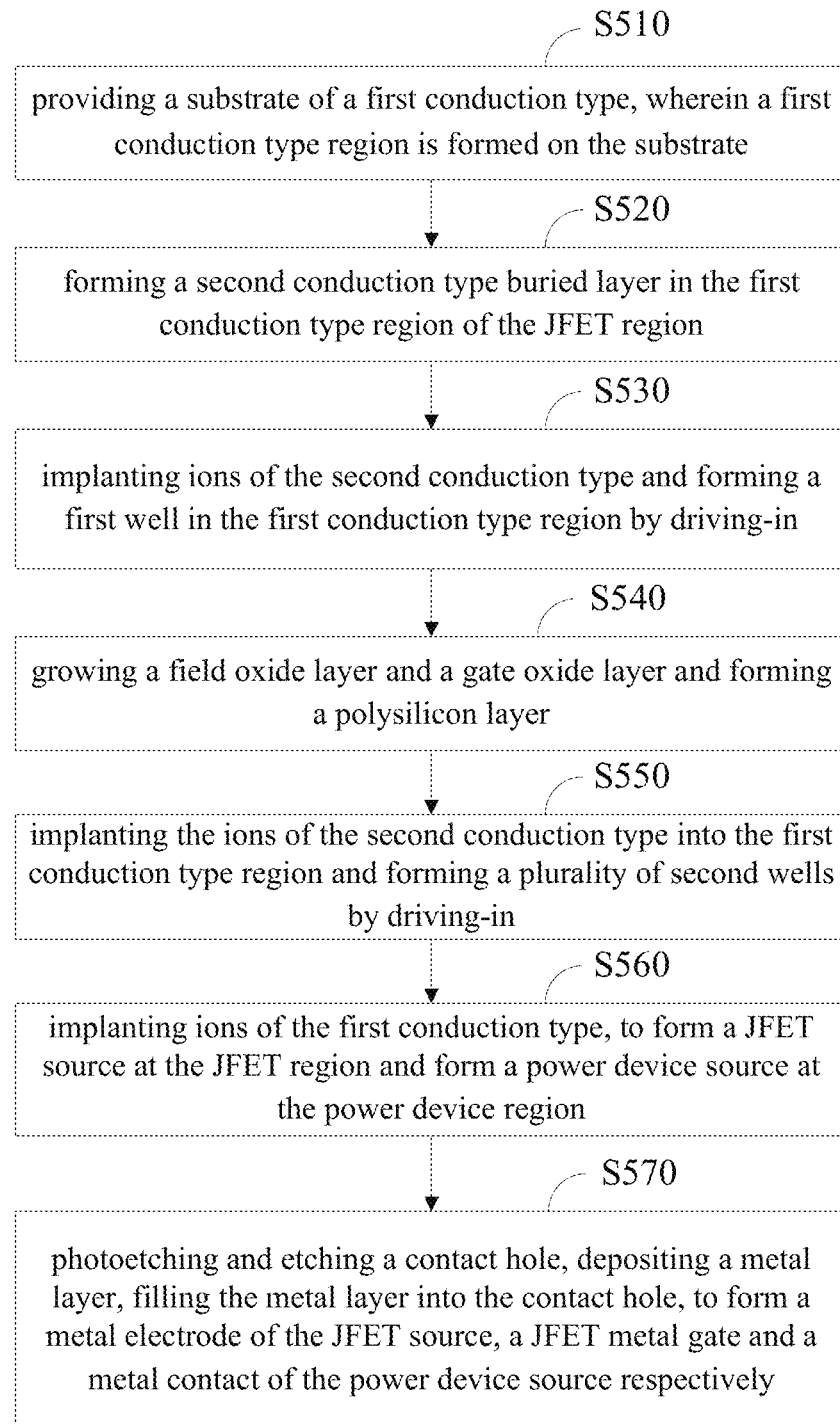
FIG. 2 is a flowchart of a method for manufacturing a device integrated with JFET in an embodiment.

FIG. 2 is a flowchart of a method for manufacturing a device integrated with JFET in an embodiment. The following method for manufacturing the device integrated with JFET will be introduced, in which the device is VDMOS, the first conduction type is an N type, and the second conduction type is a P type.

At step S510, a substrate of the first conduction type is provided, and a first conduction type region is formed on the substrate.

In the present embodiment, an N type region is formed on the N+ substrate by epitaxy, and the substrate will serve as the drain 201 of the device subsequently.

At step S520, a second conduction type buried layer is formed in the first conduction type region of the JFET region.

Figure 3A:
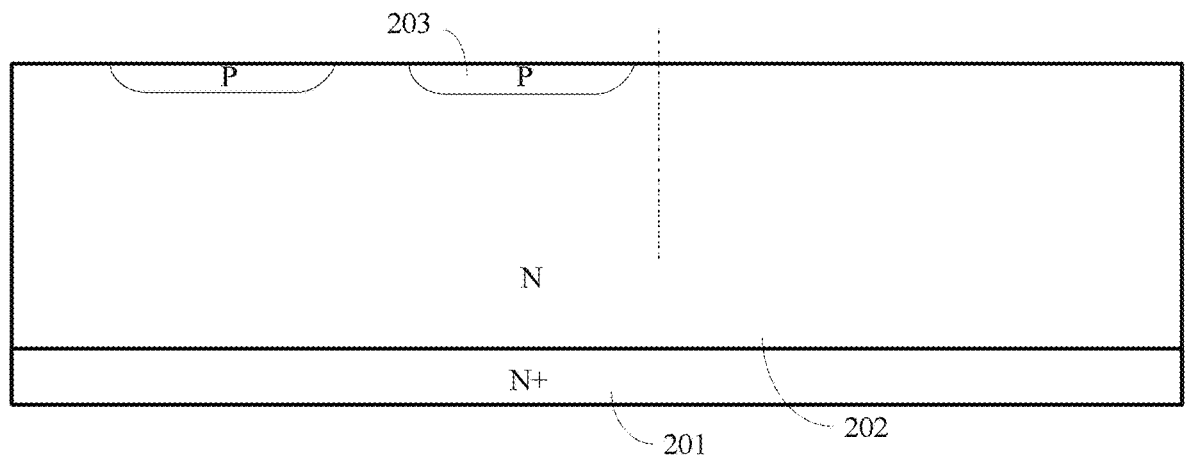
FIG. 3a to FIG. 3d are cross-sectional schematic views of the manufacturing method described in FIG. 2 in the process of manufacturing the device.

In the present embodiment, the first conduction type region includes a first epitaxial layer (that is, the first N type layer 202) and a second epitaxial layer (that is, the second N type layer 204). The Step S520 is to photoetch the first epitaxial layer, implant P type ions, and form the P type buried layer 203 by driving-in. FIG. 3*a* is a cross-sectional schematic view of the device after the P type buried layer 203 is formed. The second epitaxial layer is formed on the surface of the first epitaxial layer after the P-type buried layer 203 is formed. The P type buried layer 203 is at least in contact with the one first well 205.

At step S530, ions of the second conduction type are implanted and a first well is formed in the first conduction type region by driving-in.

In the present embodiment, The P-type ions are implanted into the N type region and the first well 205 is formed in the N type region by driving-in.

At step S540, a field oxide layer and a gate oxide layer are grown, and a polysilicon layer is formed.

A thick field oxide layer is grown on the surface of the N type region and then the gate oxide layer is grown, and the polysilicon layer 604 is formed on the surface of the N type region.

At step S550, ions of the second conduction type are implanted into the first conduction type region and a plurality of second wells are formed by driving-in.

Figure 3B:
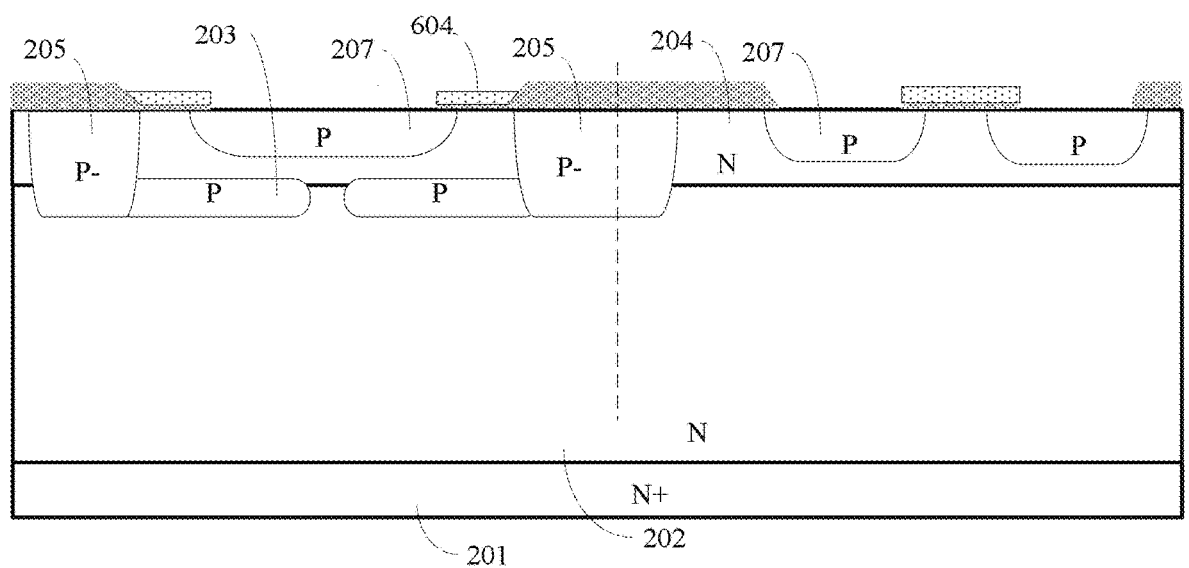

In the present embodiment, ions of the P type are implanted into the N type region by serving the field oxide layer and the polysilicon layer 604 as a mask, and the plurality of the second wells 207 are formed by driving-in. FIG. 3*b* is a cross-sectional schematic view of the device after the step S550 is completed.

Figure 3C:
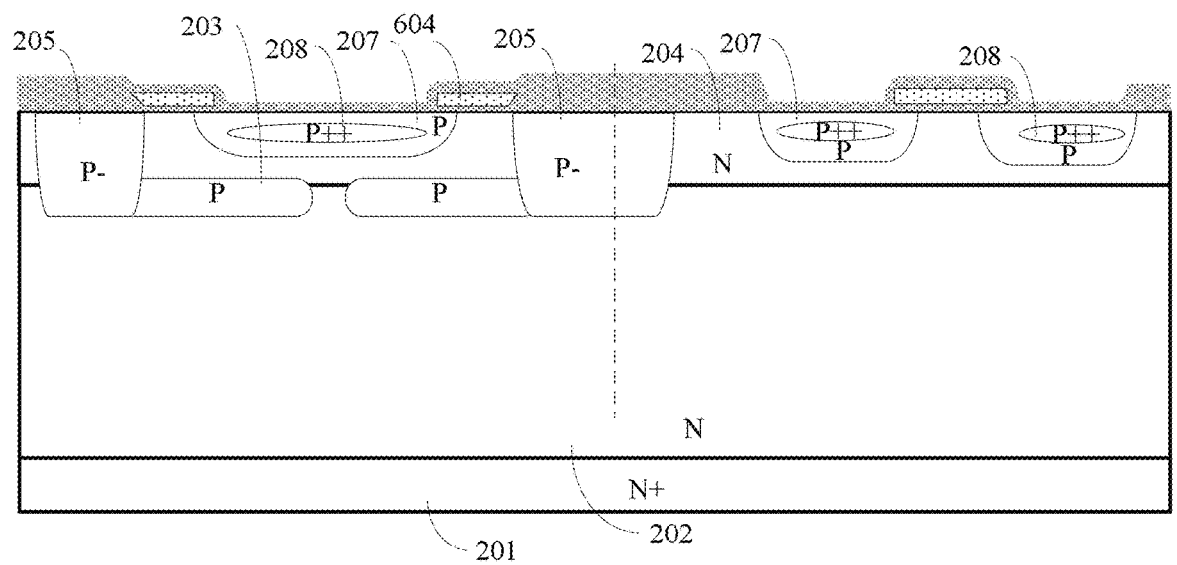

Referring to FIG. 3*c*, in the present embodiment, prior to performing a step S560, a step of implanting ions of the P type into the second well 207 is further included, to form the UIS region 208 in the second wells 207 of the JFET region and the power device region. In order to prevent adversely affecting the channel region by implanting ions of the P type into the second well 207, in the present embodiment, a step of forming the implanting barrier layer is further included prior to the step of implanting ions of the P type to form the UIS region 208. In the present embodiment, the implanting barrier layer is formed by re-forming one oxide layer. Since the oxide layer at the implanting window for implanting ions of the P type to form the UIS region 208 is thin, the implanted ions of the P type by high-energy can pass through the oxide layer to form the UIS region 208. The oxide layer at other positions is formed on the structures such as the field oxide layer and the polysilicon layer 604, so that the thickness of the entire implanting barrier layer is thick, and the ions of the P type are difficult to pass through the implanting barrier layer and to enter the N type region.

At step S560, ions of the first conduction type are implanted, to form a JFET source at the JFET region, and form a power device source at the power device region.

Figure 3D:
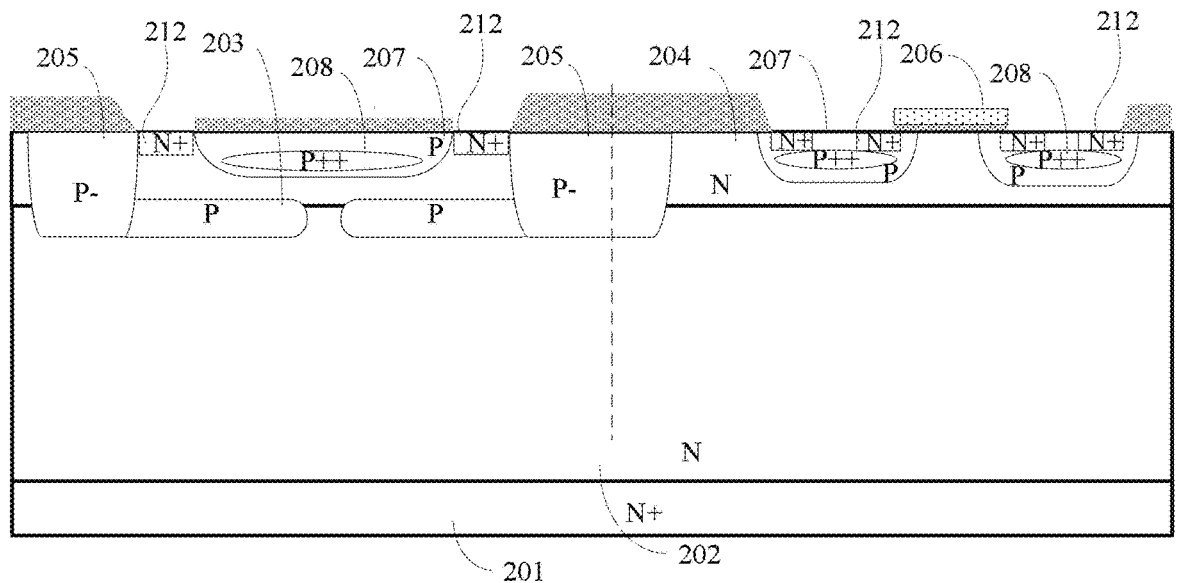

Referring FIG. 3*d*, in the present embodiment, the ions of the N type ion are implanted with the photoresist as a mask by using a photoetching process. The JFET source is formed in the second well 207 of the JFET region, and a VDMOS source 209 is formed in the second well 207 of the power device region. The VDMOS source 209 is formed in each second well 207 on both sides of the gate, and is divided into two blocks in each second well 207, leaving a position for the ohmic contact region 210 formed in the subsequent step in the middle.

In the present embodiment, after the step S560 is completed, a step of forming the gate ohmic contact 214 and the ohmic contact region 210 in the first well 205 and the second well 207 is further included. Specifically, the JFET gate ohmic contact 214 is formed in the first well 205 and the second well 207 of the JFET region, and the ohmic contact region 210 is formed in the second well 207 of the power device region.

At step S570, a contact hole is photoetched and etched, the metal layer is deposited, and the metal layer is filled into the contact hole, to form a metal electrode of the JFET source, a JFET metal gate and a metal contact of the power device source respectively.

The metal filled into the contact hole is in contact with the JFET gate ohmic contact 214 to form the JFET metal gate 213, and is in contact with the JFET source 212 to form the metal electrode of the JFET source. After depositing the metal layer, a passivation layer is formed on the surface of the device, and the cross-section of the completed device is shown in FIG. 1.

Combining with the above mentioned advantages, the above mentioned device integrated with JFET improves the stability of the pinch-off voltage, solidifies the breakdown point, strengthens the UIS capability, is completely matched with the process, and realizes adjustability of the pinch-off voltage on the basis of the conventional technology.

In one of the embodiments, the step S520 includes: forming one first well 205 at a boundary between the JFET region and the power device region as an isolation well, and the isolation well is configured to isolate the JFET region from the power device region.

In one embodiment, an implantation concentration of the first well 205 of the step S530 is between $1.5E13$ cm$^{-2}$ and $2.2E13$ cm$^{-2}$, and the well depth of the first well 205 is between 8.5 microns and 13.5 microns.

The above described embodiments are merely illustrative of several embodiments of the present disclosure, and the description thereof is more specific and detailed, but is not to be construed as limiting the scope of the present disclosure. It should be noted that several variations and modifications may be made by those persons skilled in the art and belong to the scope of protection of the present disclosure without departing from the spirit. Therefore, the scope of protection of the present disclosure should be subject to the appended claims.

What is claimed is:

1. A device integrated with a junction field effect transistor (JFET), the device is divided into a JFET region and a power device region, and the device comprises:
a drain with a first conduction type, while a part of the drain is located in the JFET region and the other part of the drain is located in the power device region; and
a first conduction type region disposed on a front surface of the drain, while a part of the first conduction type region is located in the JFET region, and the other part of the first conduction type region is located in the power device region;
the JFET region comprises:
a first well with a second conduction type, which is formed in the first conduction type region;
a second well with a second conduction type, which is formed in the first conduction type region, while an ion concentration of the second well is higher than an ion concentration of the first well and the first conduction type is opposite to the second conduction type;
a JFET source with the first conduction type;
a metal electrode formed on the JFET source, which is in contact with the JFET source; and
a second conduction type buried layer formed under the JFET source and the second well;
an isolation well located at a boundary between the JFET region and the power device region, the isolation well isolating the JFET region from the power device region.

2. The device of claim 1, wherein the JFET region further comprises a JFET metal gate and a JFET gate ohmic contact, the JFET metal gate is formed on the JFET gate ohmic contact and in contact with the JFET gate ohmic contact, the JFET gate ohmic contact is formed in the first well and the second well of the JFET region and the isolation well, and each of the JFET gate ohmic contacts is equipotentially connected with each other via the JFET metal gate.

3. The device of claim 2, wherein the second conduction type buried layer is at least in contact with the first well of the JFET region.

4. The device of claim 1, wherein the JFET source is formed between the second well of the JFET region and the first well of the JFET region being adjacent to the second well of the JFET region.

5. The device of claim 1, wherein the device is a vertical double-diffused metal-oxide-semiconductor field-effect transistor (VDMOS).

6. The device of claim 5, wherein the power device region comprises:
a gate;
a second well;
a VDMOS source disposed in the second well of the power device region and having the first conduction type; and
an unclamped inductive switching region disposed in the second well of the power device region and under the VDMOS source, while the unclamped inductive switching region has the second conduction type, and an ion concentration of the unclamped inductive switching region is higher than an ion concentration of the second well of the power device region.

7. The device of claim 6, wherein one second well of the power device region exists on each of two sides under the gate, the VDMOS source is formed in the two second wells of the power device region, and the VDMOS source is divided into two blocks in each of the two second wells of the power device region, and the device further comprises an ohmic contact region of the second conduction type formed between the two blocks of the VDMOS source.

8. The device of claim 1, wherein the first conduction type is an N type, the second conduction type is a P type, and the first conduction type region is an N type epitaxial layer.

9. The device of claim 8, wherein the N type epitaxial layer comprises a first N type region and a second N type region on the first N type region.

10. The device of claim 9, wherein a thickness of the N type epitaxial layer is between 4 microns and 7 microns.

* * * * *